United States Patent
Lin et al.

(10) Patent No.: US 11,522,073 B2
(45) Date of Patent: Dec. 6, 2022

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Chih-Han Lin, Hsinchu (TW); Chen-Ping Chen, Yilan County (TW); Kuei-Yu Kao, Hsinchu (TW); Hsiao Wen Lee, Hsinchu (TW)

(73) Assignee: TAIWAN SEMICONDUTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 17/081,877

(22) Filed: Oct. 27, 2020

(65) Prior Publication Data
US 2022/0130978 A1 Apr. 28, 2022

(51) Int. Cl.
*H01L 31/062* (2012.01)
*H01L 31/113* (2006.01)
*H01L 29/66* (2006.01)
*H01L 29/06* (2006.01)
*H01L 21/8234* (2006.01)
*H01L 27/088* (2006.01)
*H01L 29/78* (2006.01)

(52) U.S. Cl.
CPC .. *H01L 29/6681* (2013.01); *H01L 21/823431* (2013.01); *H01L 21/823481* (2013.01); *H01L 27/0886* (2013.01); *H01L 29/0649* (2013.01); *H01L 29/66545* (2013.01); *H01L 29/785* (2013.01)

(58) Field of Classification Search
CPC ......... H01L 29/6681; H01L 21/823431; H01L 21/823481; H01L 27/0886; H01L 29/0649; H01L 29/66545; H01L 29/785
USPC .......................................... 257/288
See application file for complete search history.

(56) References Cited

U.S. PATENT DOCUMENTS

2017/0110456 A1* 4/2017 Jeon ................ H01L 21/823878

* cited by examiner

*Primary Examiner* — Theresa T Doan
(74) *Attorney, Agent, or Firm* — Foley & Lardner LLP

(57) ABSTRACT

A method of fabricating a semiconductor device is disclosed. The method includes forming semiconductor fins on a substrate. A first dummy gate is formed over the semiconductor fins. A recess is formed in the first dummy gate, and the recess is disposed between the semiconductor fins. A dummy fin material is formed in the recess. A portion of the dummy fin material is removed to expose an upper surface of the first dummy gate and to form a dummy fin. A second dummy gate is formed on the exposed upper surface of the first dummy gate.

20 Claims, 20 Drawing Sheets

SEMICONDUCTOR DEVICES AND METHODS OF MANUFACTURING THEREOF

BACKGROUND

This disclosure relates generally to a semiconductor device, and in some embodiments, to transistor devices that includes dummy fins.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

Fin field-effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

In contemporary semiconductor device fabrication processes, a large number of semiconductor devices, such as field effect transistors are fabricated on a single wafer. Non-planar transistor device architectures, such as fin-based transistors ("FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor or GAAFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7A, 7B, 8A, 8B, 8C, 9, 11 and 12, illustrate cross-sectional views cut along a direction (X-X direction in FIG. 17 perspective view) of the gate of a semiconductor device, made by the method of FIG. 1, during various fabrication stages in accordance with some embodiments. FIG. 7B illustrates an alternative to FIG. 7A. FIGS. 8B and 8C illustrate an alternative to FIG. 8A.

DETAILED DESCRIPTION

Figure 1:
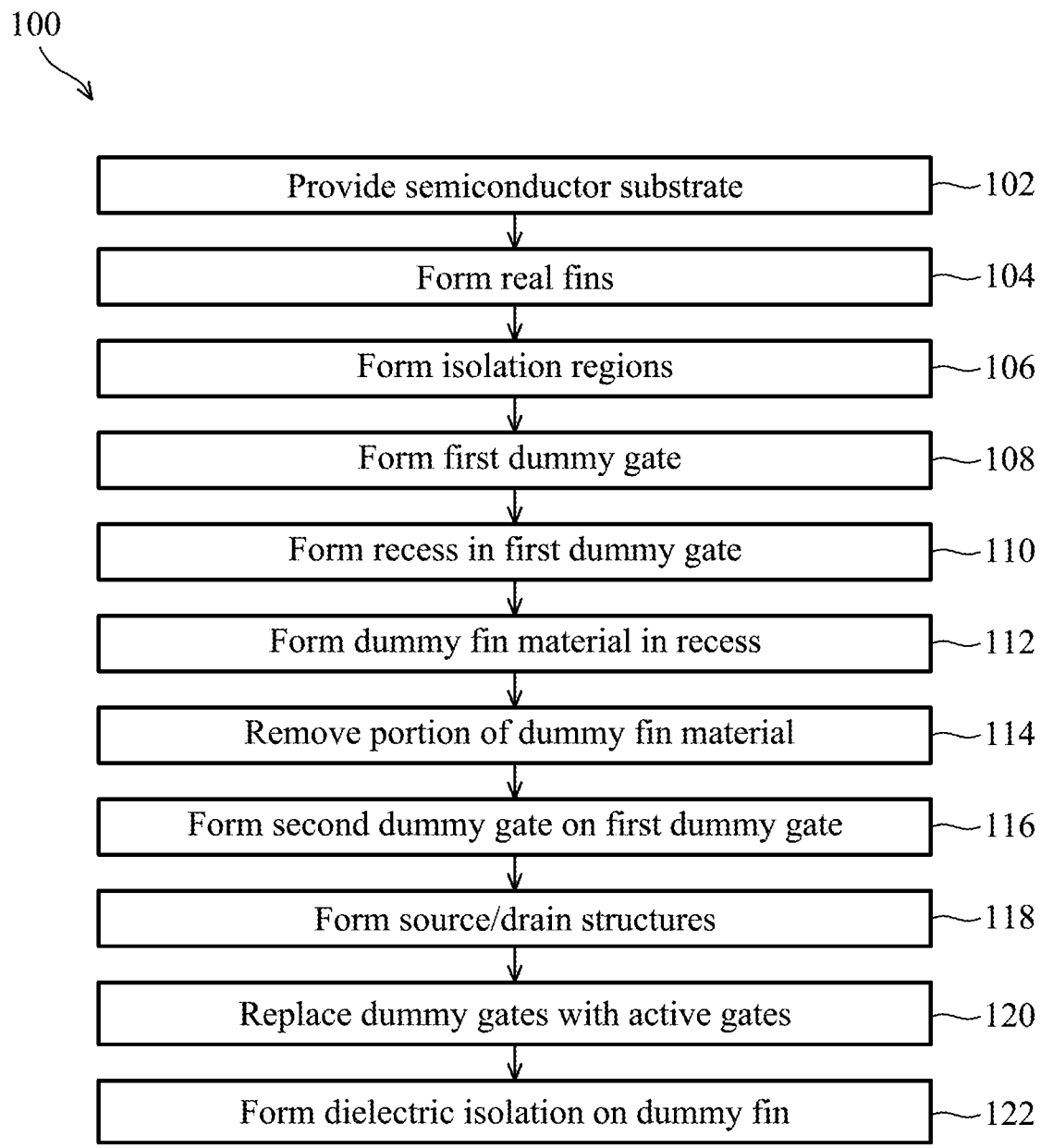
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a non-planar transistor, and in particular, in the context of forming a transistor having a conduction channel out of a plane in which a substrate is disposed. In some embodiments, semiconductor fins are formed on a substrate. A first dummy gate is subsequently formed over the semiconductor fins. A recess is then formed in the first dummy gate, where the recess is disposed between the semiconductor fins. Subsequently a dummy fin material is formed in the recess, and a portion of the dummy fin material removed to expose an upper surface of the first dummy gate and form a dummy fin. A second dummy gate is the formed on the exposed upper surface of the first dummy gate.

A fin-based transistor formed by the above described method can advantageously avoid voids during dummy gate formation. In FinFET and GAAFET production, processing may include the formation of dummy fins (dummy channels) and dummy gates. Voids or seams may occur in dummy gate formation in the case where dummy channels are formed between real channels (semiconductor fins) prior to the deposition of material for the dummy gates. According to disclosed embodiments, a first dummy gate material is deposited over the semiconductor fins prior to deposition of material for the dummy fin. This order of processing steps avoids the formation of voids or seams in the first dummy gate material. Once the first dummy gate material is deposited, the dummy fins are formed, followed by a second dummy gate material deposition for completion of the dummy gate material. In this way, according to some embodiments, processing employing both dummy fins and dummy gates is possible while avoiding the formation of voids or seams in the dummy gate material. According to some embodiments, the described method results in device yield improvement.

FIG. 1 illustrates a flowchart of a method 100 to form a non-planar transistor device, according to one or more embodiments of the present disclosure. For example, at least some of the operations (or steps) of the method 100 can be used to form a FinFET, or a GAA or transistor device such as, for example, a nanosheet transistor device, a nanowire transistor device, a vertical transistor device, or the like. Further, the method 100 can be used to form a GAA transistor (or FinFET transistor) device in a respective conduction type such as, for example, an n-type GAA transistor device or a p-type GAA transistor device. The term "n-type," as used herein, may be referred to as the conduction type of a transistor having electrons as its conduction carriers; and the term "p-type," as used herein, may be referred to as the conduction type of a transistor having holes as its conduction carriers.

Referring to FIG. 1, the method 100 starts with operation 102 in which a semiconductor substrate is provided. The method 100 continues to operation 104 in which multiple semiconductor fins are formed extending beyond a major surface of the semiconductor substrate. The method 100 continues to operation 106 in which isolation regions are formed. The method 100 continues to operation 108 in which a first dummy gate is formed over the semiconductor fins and the isolation regions. The method 100 continues to operation 110 in which a recess is formed in the first dummy gate between the semiconductor fins. The method 100 continues to operation 112 in which a dummy fin material is formed in the recess. The method 100 continues to operation 114 in which a portion of the dummy fin material is removed exposing an upper surface of the first dummy gate and leaving a dummy fin in the recess. The method 100 continues to operation 116 in which a second dummy gate is formed on the upper surface of the first dummy gate. The method 100 continues to operation 118 in which source/drain structures are formed. The method 100 continues to operation 120 in which first and second dummy gates are replaced with active gates. The method 100 continues to operation 122 in which dielectric isolation is formed on a dummy fin covered by the active gate.

Figure 2:
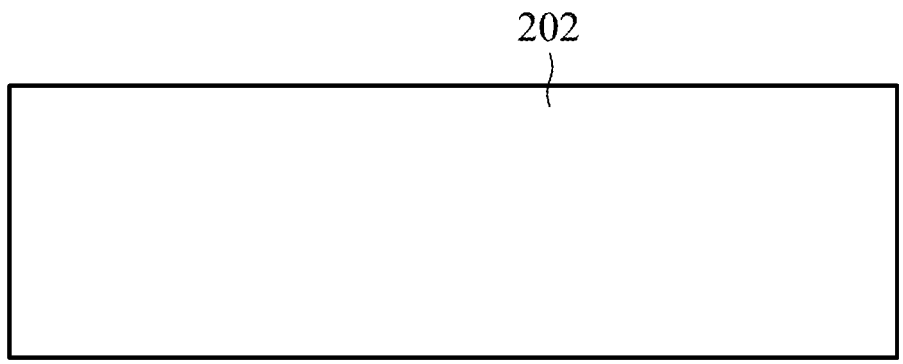

Corresponding to operation 102 of FIG. 1, FIG. 2 is a cross-sectional view of a FinFET 200 including a substrate 202 at one of the various stages of fabrication, according to some embodiments. The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
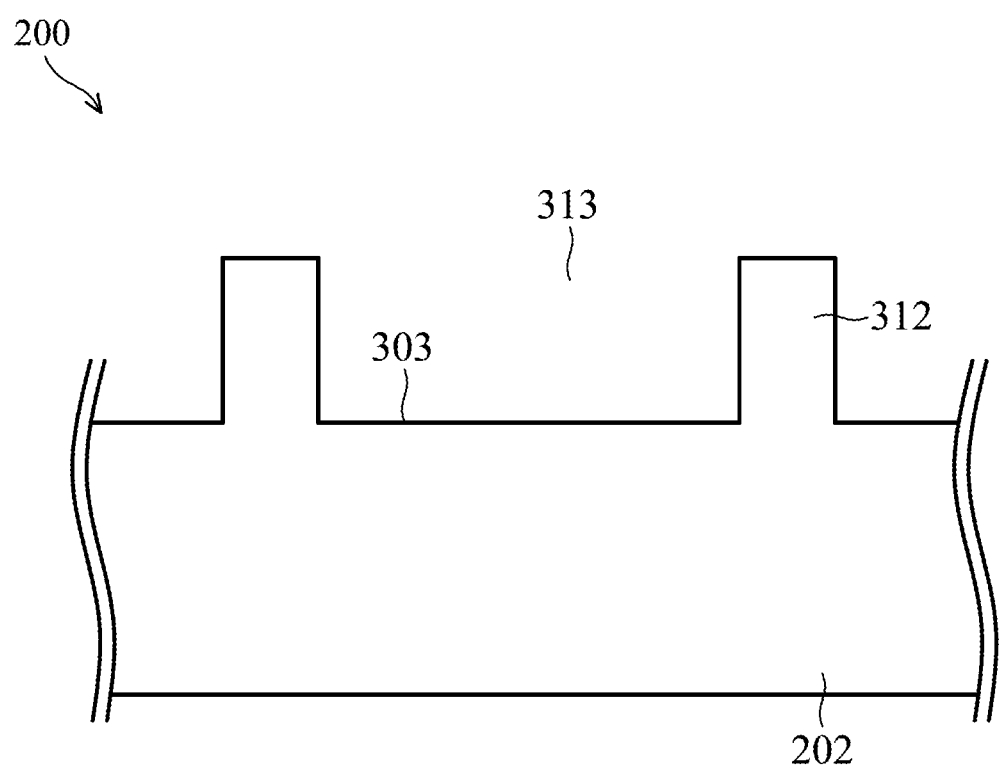

Corresponding to operation 104 of FIG. 1, FIG. 3 is cross-sectional view of the FinFET 200 including a plurality of semiconductor fins 312 at one of the various stages of fabrication, according to some embodiments. The semiconductor fins 312 are formed by at least some of the following processes. The semiconductor fins 312 may be formed using photolithography techniques. A photoresist may be formed on the semiconductor substrate 202 and patterned. The photoresist may etched through openings to expose the underlying semiconductor substrate 202. The exposed semiconductor substrate 202 is then etched to form the trenches 313 so as to cause a surface 303 of the semiconductor substrate 202 to be exposed. The trenches 313 are thus formed between adjacent semiconductor fins 312, which extend from the semiconductor substrate 202. The semiconductor fins 312 each extend upward from the surface 303. The trenches 313 may be strips (viewed from the top of the FinFET 200) parallel to each other, and closely spaced with respect to each other. After the semiconductor fins 312 are formed, the photoresist is removed. Subsequently, a cleaning process may be performed to remove a native oxide of the semiconductor substrate 202. The cleaning may be performed using diluted hydrofluoric (DHF) acid, or the like.

Figure 4:
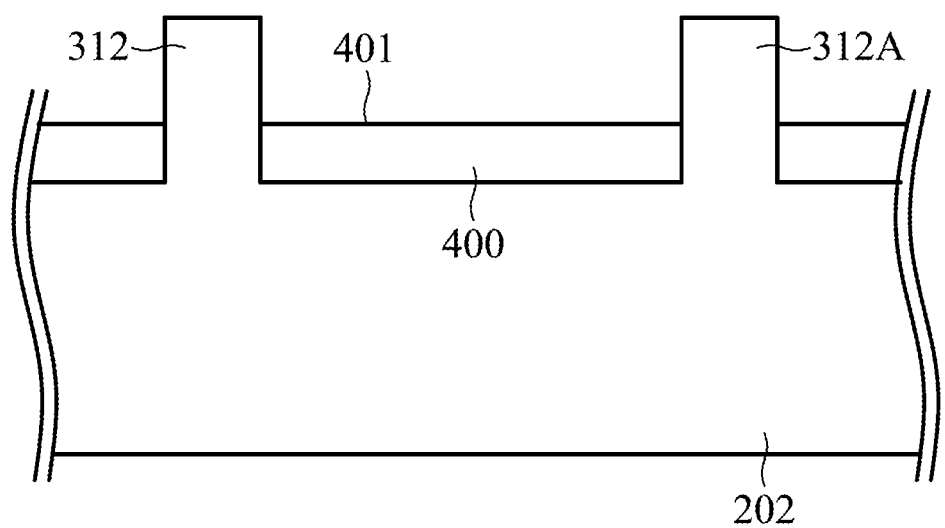

Corresponding to operation 106 of FIG. 1, FIG. 4 is a cross-sectional view of the FinFET 200 including isolation regions 400 at one of the various stages of fabrication, according to some embodiments. The isolation regions 400, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In some embodiments, the insulation material may be silicon oxide formed by a FCVD process. An anneal process may be performed once the insulation material is formed. A planarization process, such as a chemical mechanical polish (CMP), may remove any excess insulation material and form top surfaces of the isolation regions 400 and a top surface of the semiconductor fins 312 that are coplanar (not shown).

In some embodiments, the isolation regions 400 include a liner, e.g., a liner oxide (not shown), at the interface between each of the isolation regions 400 and the substrate 202 (fins 312). In some embodiments, the liner oxide is formed to, for example reducing crystalline defects at the interface between the substrate 202 and the isolation region 400. Similarly, the liner oxide may also be used to reduce crystalline defects at the interface between the fins 312 and the isolation region 400. The liner oxide (e.g., silicon oxide) may be a thermal oxide formed through a thermal oxidation of a surface layer of the substrate 202, although other suitable methods may also be used to form the liner oxide.

Next, the isolation regions 400 are recessed to form shallow trench isolation (STI) regions 400, as shown in FIG. 4. The isolation regions 400 are recessed such that the upper portion of the semiconductor fins 312 (hereinafter "fin 312A") protrude from between neighboring STI regions 400. In other words, the fin 312A is protruded from a top surface 401 of the STI regions 400. The top surface 401 of the STI regions 400 may have a flat surface (as illustrated), a convex surface, a concave surface (such as dishing), or combinations thereof. The top surface 401 of the STI regions 400 may be formed flat, convex, and/or concave by an appropriate etch. The isolation regions 400 may be recessed using an acceptable etching process, such as one that is selective to the material of the isolation regions 400. For example, a dry etch or a wet etch using dilute hydrofluoric (DHF) acid may be performed to recess the isolation regions 400.

Figure 5:
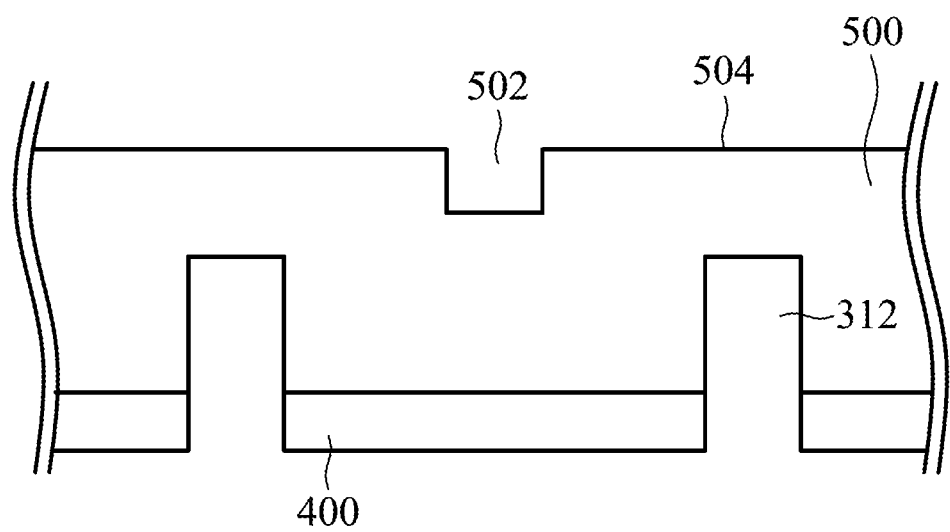

Corresponding to the operation 108 of FIG. 1, FIG. 5 is a cross-sectional view of the FinFET 200 including a first dummy gate structure 500 at one of the various stages of fabrication, according to some embodiments. The first dummy gate structure 500 is deposited on the semiconductor fins 312. The first dummy gate structure 500 may be formed of Si or SiGe, for example. The first dummy gate structure 500 may be formed in a conformal manner with an initial recess 502 formed between and above the semiconductor fins.

Figure 6:
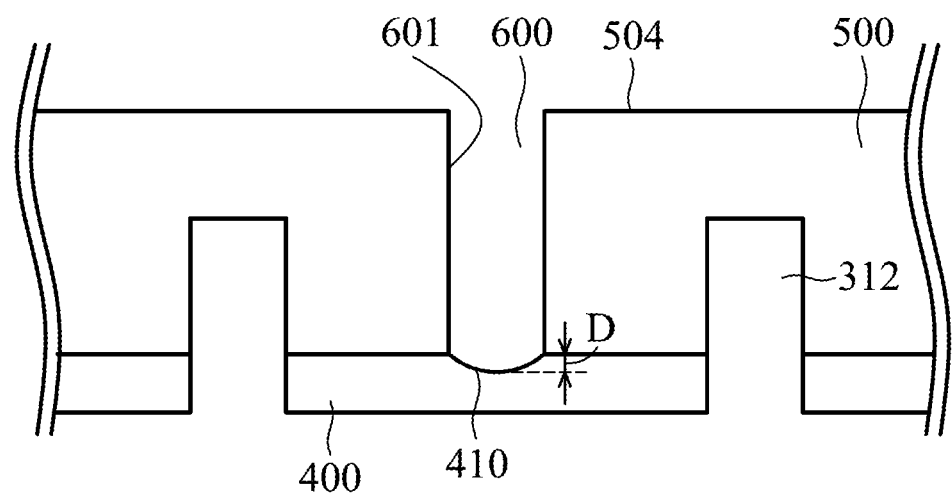

Corresponding to the operation 110 of FIG. 1, FIG. 6 is a cross-sectional view of the FinFET 200 including a forming a recess 600 in the first dummy gate structure 500 at one of the various stages of fabrication, according to some embodiments. The recess 600 formed in the first dummy gate structure 500 may be formed in the initial recess 502. The recess 600, for example, may be formed by a photolithographic process using a patterned photoresist as an etch mask. The recess 600 may be formed by an anisotropic etch, such as a dry etch. The recess 600 may be formed so as to expose the underlying isolation regions 400.

Forming the recess 600 in the first dummy gate structure 500 may further form a recess 410 having a depth D in the underlying isolation regions 400, depending on the etch selectivity between the first dummy gate structure 500 and the underlying isolation regions 400. For a high etch selectivity selectively etching the first dummy gate structure 500, the depth D of the recess 410 may be small or non-existent. A high etch selectivity to the first dummy gate structure 500 may be accomplished, for example, by tuning the gas selection, for example using a F-based etch with high dielectric etch rate as compared to a Br-based etch. As another example, the high selectivity may be achieved by tuning the etch bias power. The size of the recess D may be in the range of 0 nm to 100 nm, for example.

Figure 7A:
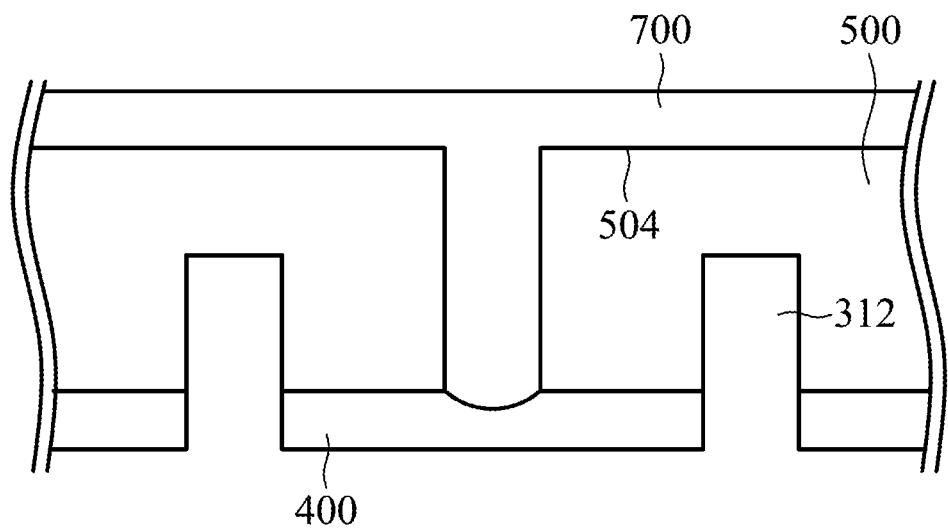

Corresponding to the operation 112 of FIG. 1, FIG. 7A is a cross-sectional view of the FinFET 200 including forming a dummy fin material 700 in the recess 600, and on an upper surface 504 of the first dummy gate structure 500. The dummy film material 700 may be a dielectric material, for example. The dummy fin material 700 may include a material selected from the group consisting of silicon oxide, silicon nitride, silicon carbide, silicon oxycarbide, silicon oxynitride, silicon carbonitride, silicon oxycarbonitride, and combinations thereof. The dummy fin material 700 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the dummy fin material 700 may include a high-k dielectric material. As such, the dummy fin material 700 may have a k value greater than about 4.0 or even greater than about 7.0, and may include a metal oxide or a silicate of Hf, Al, Zr, La, Mg, Ba, Ti, Pb, and combinations thereof. The dummy fin material 700 may be TaN, TaO, or HfO, for example. The formation methods of such a high-k dummy fin material 700 may include CVD molecular beam deposition (MBD), atomic layer deposition (ALD), PECVD, and the like.

Figure 7B:
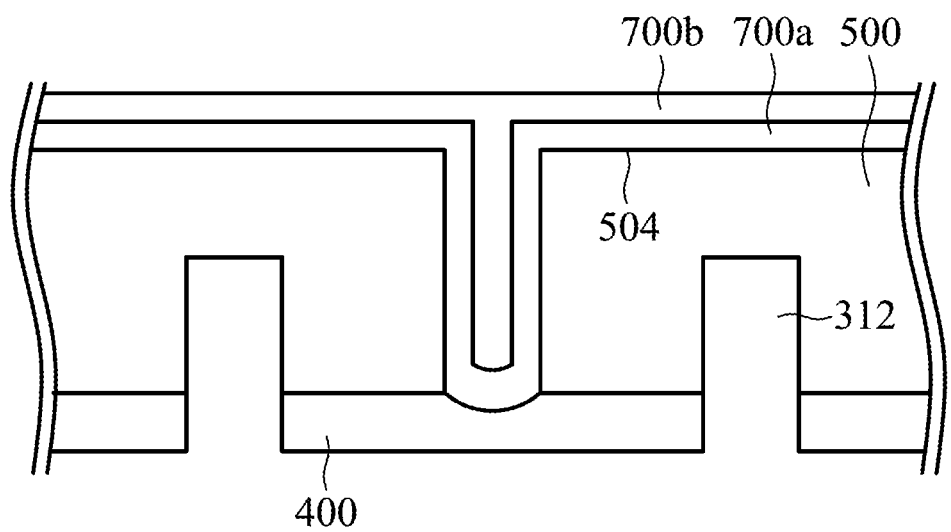

The dummy fin material 700, in some embodiments may be formed of a single material as shown in FIG. 7A or may be formed of multiple sublayers, as shown in FIG. 7B, where the sublayers may have a same, similar, or different compositions. FIG. 7B illustrates the dummy fin material 700 to have a first dummy fin sublayer 700a and a second dummy fin sublayer 700b, where the dummy fin sublayer 700a is formed in the recess 600, and the second dummy fin sublayer 700b is formed on the first dummy fin sublayer 700a. Both the first dummy fin sublayer 700a and the second dummy fin sublayer 700b may be formed in a conformal manner.

Figure 8A:
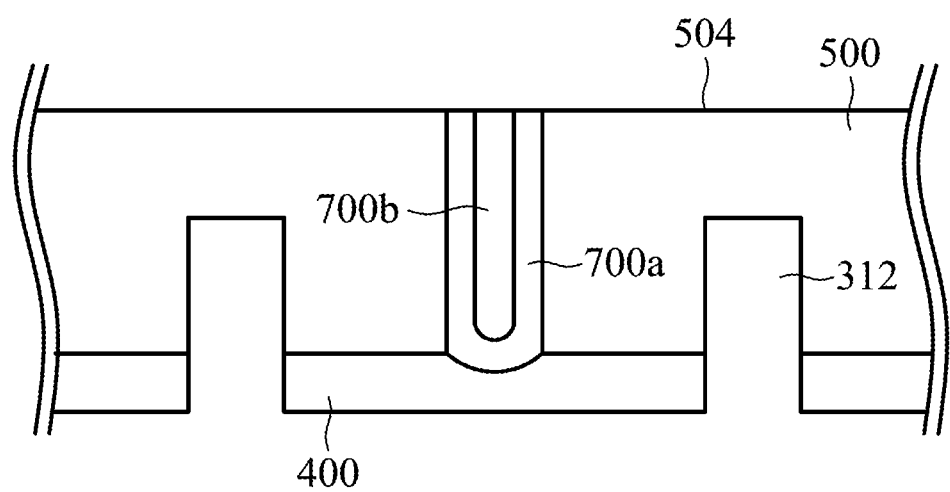

Corresponding to the operation 114 of FIG. 1, FIG. 8A is a cross-sectional view of the FinFET 200 including in which a portion of the dummy fin material 700 is removed thus exposing the upper surface 504 of the first dummy gate 500 and leaving a dummy fin 800 in the recess. As described above the dummy fin material 700 may be of a single material or may include sub-layers 700a and 700b. The dummy fin material 700 may be removed in an upper region exposing the upper surface 504 of the first dummy gate 500 and leaving a dummy fin 800 in the recess 600, where the removing may be a planarization process and/or an etch back process. The planarization process may include a chemical mechanical polish (CMP). The etch back process may be anisotropic or isotropic, for example.

The dummy fin material 700 may be etched or polished so as leave the dummy fin material 700 in the recess with an upper surface coplanar with the upper surface 504 of the first dummy gate 500. Alternatively, the dummy fin material 700 may be etched or polished so as leave the dummy fin material 700 in the recess 600 with an upper surface below the upper surface 504 of the first dummy gate 500 as shown in FIG. 8B and FIG. 8C.

The etch back process of the dummy fin material 700 may be anisotropic or isotropic, for example. As shown in FIG. 8B, the etch back may leave an upper surface of the sub-layers 700a and 700b with a V shape for an anisotropic etch back, and as shown in FIG. 8C, the etch back may leave an upper surface of the sub-layers 700a and 700b with a flat shape for an isotropic etch back. For an anisotropic etch back, the specific etchants will depend on the material or materials of the dummy fin material 700. The etchants for the anisotropic etch back may be dry etchants, for example. For an isotropic etch back, the specific etchants will also depend on the material or materials of the dummy fin material 700. The etchants for the isotropic etch back may be wet etchants, for example.

Figure 8B:
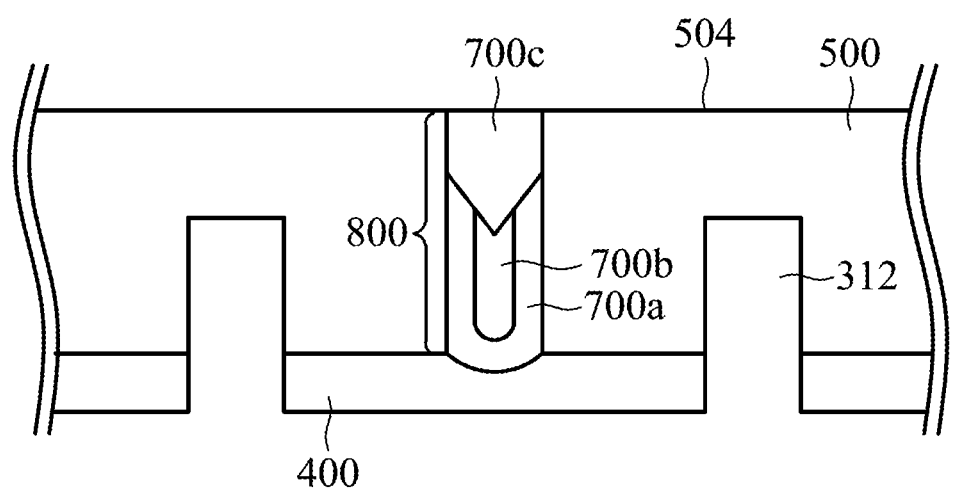
Figure 8C:
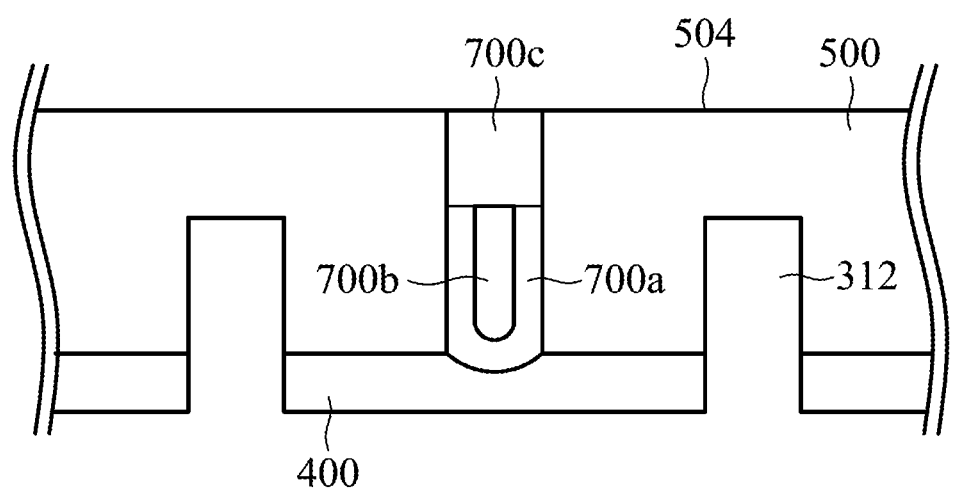

In some embodiments, as shown in FIGS. 8B and 8C, a third sublayer 700c of the dummy fin material 700 may be formed to fill an upper region 601 of the recess 600 above the sub-layers 700a and 700b. For example, following a conformal deposition of the third sublayer 700c on the first dummy gate 500 and into the upper region 601 of the recess 600, the third sublayer 700c is etched back or polished to remove the third sublayer 700c from the upper surface 504 of the first dummy gate 500.

The number of sublayers may be between 1 and 10, for example. For n sublayers, the first n−1 sublayers may be formed conformally in the recess 600, and then etched back to expose the upper region 601 of the recess 600. The deposition of the nth sublayer fills the recess 600 followed by planarization to remove the nth sublayer from the upper surface 504 of the first dummy gate 500.

Figure 9:
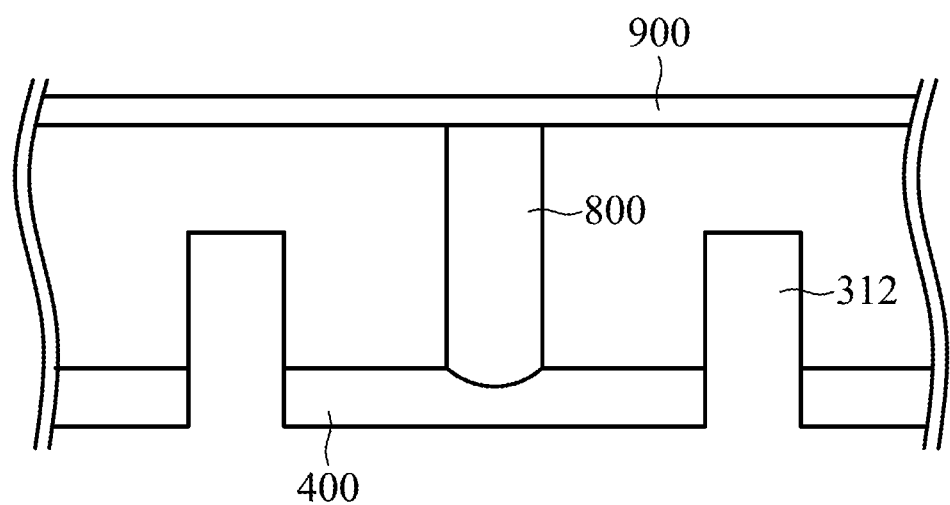

Corresponding to the operation 116 of FIG. 1, FIG. 9 is a cross-sectional view of the FinFET 200 including forming a second dummy gate 900 on the first dummy gate 500. The second dummy gate 900 may be of a same material, similar material, or a different material than the first dummy gate 500. For example, the second dummy gate 900 may be formed of Si or SiGe, for example. The second dummy gate 900 may be formed on the first dummy gate 500, and over the dummy fin 800.

Figure 10:
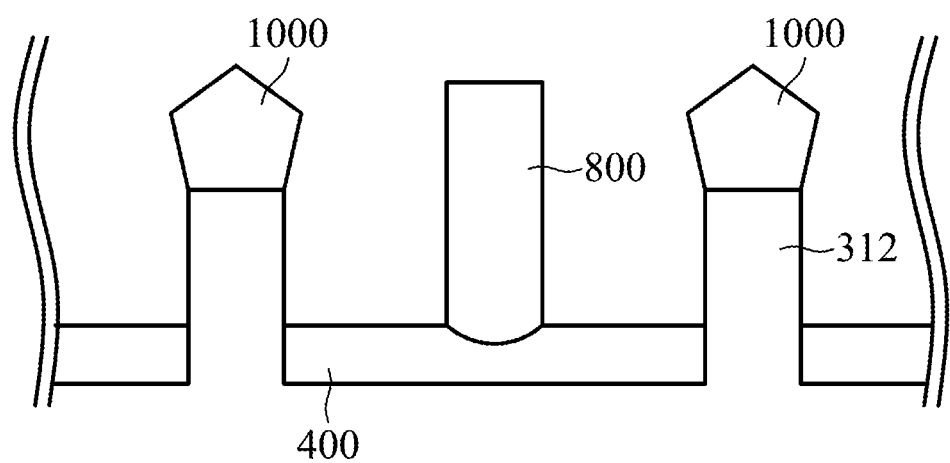
FIG. 10 illustrates a cross-sectional view cut along a direction X'-X' of FIG. 17, made by the method of FIG. 1, during a fabrication stage for forming source/drain regions in accordance with some embodiments.

Corresponding to the operation 118 of FIG. 1, FIG. 10 is a cross-sectional view of the FinFET 200 in which source/drain regions 1000 are formed. The cross-section of FIG. 10 is along the line X'-X' in FIG. 17. The source/drain regions 1000 are formed on the opposite sides of the dummy gate (not shown in FIG. 10) comprising the first dummy gate 500 and second dummy gate 900.

The source/drain regions 1000 are formed by epitaxially growing a semiconductor material in a fin recess of the semiconductor fin 312A. Thus, it is appreciated that although the source/drain regions 1000 are vertically spaced apart from the fin 312, each of the source/drain regions 1000 is extended from (e.g., physically connected to) the ends of the fin 312A, which functions as the conduction channel of the FinFET 200. Various suitable methods can be used to epitaxially grow the source/drain regions 1000 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting FinFET 200 is an n-type FinFET, the source/drain regions 1000 may include silicon carbide (SiC), silicon phosphorous (SiP), phosphorous-doped silicon carbon (SiCP), or the like. When the resulting FinFET 200 is a p-type FinFET, the source/drain regions 1000 may include SiGe, and a p-type impurity such as boron or indium.

The source/drain regions 1000 may be implanted with dopants to form the source/drain regions 1000, followed by an anneal process. The implanting process may include forming and patterning masks such as a photoresist to cover the regions of the FinFET 200 that are to be protected from the implanting process. The source/drain regions 1000 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain region 1000 of a P-type transistor. N-type impurities, such as phosphorous or arsenide, may be implanted in the source/drain regions 1000 of an N-type transistor. In some embodiments, the epitaxial source/drain regions may be in situ doped during growth.

Figure 11:
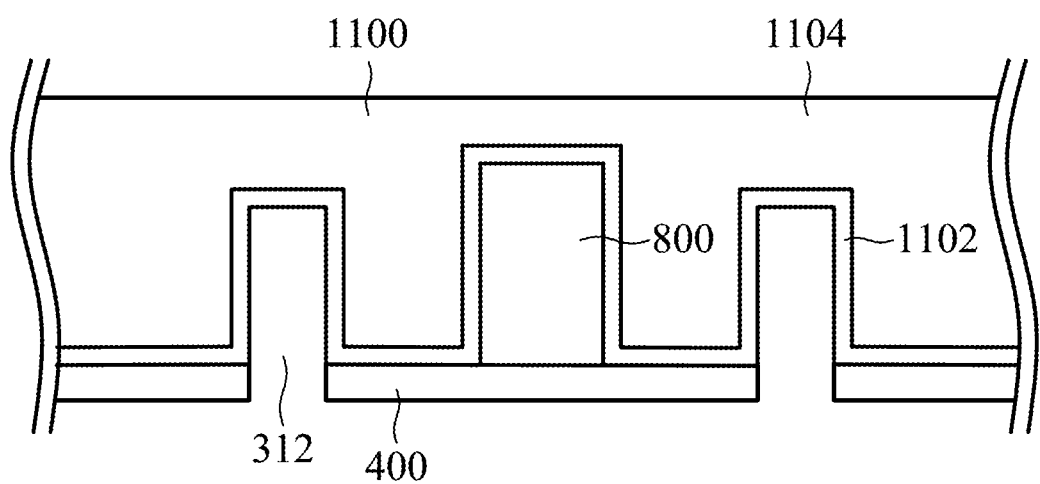

Corresponding to the operation 120 of FIG. 1, FIG. 11 is a cross-sectional view of the FinFET 200 in which the first and second dummy gates 500 and 900 are replaced by an active gate 1100 structure. An example gate-last process (sometimes referred to as replacement gate process) is performed subsequently to replacing the first and second dummy gates 500 and 900 with the active gate 1100 structure (which may also be referred to as a replacement gate structure or a metal gate structure).

In some embodiments, the active gate 1100 structure may include at least one gate dielectric layer 1102 and at least one conductive gate electrode 1104, as shown in the cross-sectional view of FIG. 11. The central portions of the semiconductor fin 312A is overlaid by the conductive gate electrode 1104 with the gate dielectric layer 1102 sandwiched therebetween. The gate dielectric layer 1102 may include a high-k dielectric material (e.g., with a k value greater than about 4.0 or even greater than about 7.0). In such embodiments, the high-k dielectric layer 1102 may include a material selected from: $Al_2O_3$, HfAlO, HfAlON, AlZrO, $HfO_2$, $HfSiO_x$, $HfAlO_x$, $HfZrSiO_x$, HfSiON, $LaAlO_3$, $ZrO_2$, or combinations thereof. The high-k dielectric layer 1104 may be formed using a suitable process such as ALD, CVD, PVD, plating, or combinations thereof. The conductive gate electrode 1104 may include a metal material such as, for example, Al, Cu, W, Ti, Ta, TiN, TiAl, TiAlN, TaN, NiSi, CoSi, or combinations thereof. In some other embodiments, the conductive gate electrode 1104 may include a polysilicon material. The polysilicon material may be doped with a uniform or non-uniform doping concentration. The conductive gate electrode 1104 may be formed using a suitable process such as ALD, CVD, PVD, plating, or combinations thereof.

Figure 12:
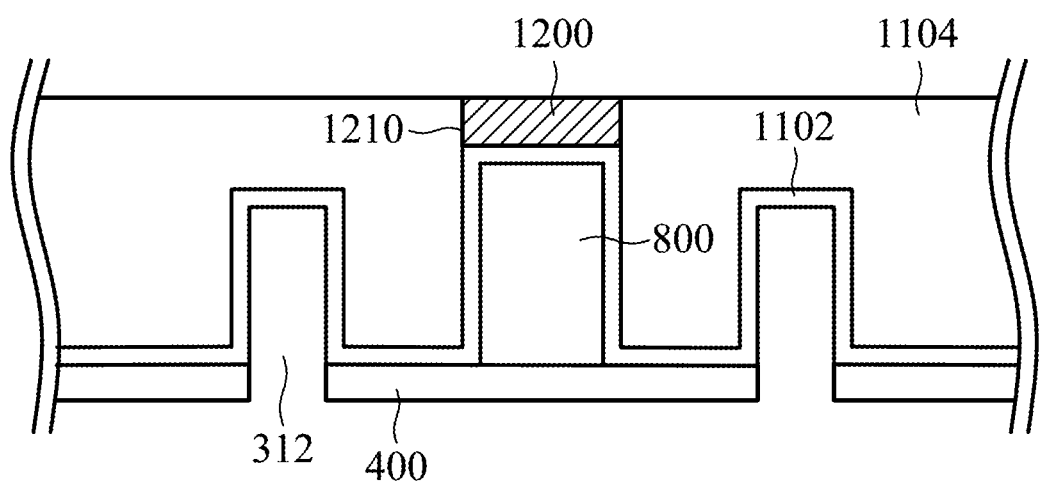

Corresponding to the operation 122 of FIG. 1, FIG. 12 is a cross-sectional view of the FinFET 200 in which dielectric isolation is formed on a dummy fin 800, which is initially covered by the active gate 1100. After the dummy gates 500 and 900 are removed, the active gate 1100 may be formed so as cover the dummy fin 800. In some embodiments the dummy fin 800 is left covered by the active gate.

In other embodiments, such as illustrated in FIG. 12, regions of the active gate 1100 may be separated from each other by providing dielectric isolation 1200 between the regions of the active gate. For example, a recess 1210 is formed in the active gate 1100 to expose the dummy fin 800, followed by filling the recess 1210 with the dielectric isolation 1200.

The dielectric isolation 1200 may include a dielectric material. The dielectric material may be, for example, silicon oxide, silicon nitride, silicon oxynitride, silicon carbide, silicon carbonitride, silicon oxycarbonitride, silicon oxycarbide, multilayers thereof, or the like. The dielectric isolation 1200 can be formed by depositing the dielectric material in the recess 1210 using any suitable method, such as CVD, PECVD, or FCVD. After the deposition, a CMP may be performed to remove any excess dielectric material from the remaining active gate 1100.

Figure 13:
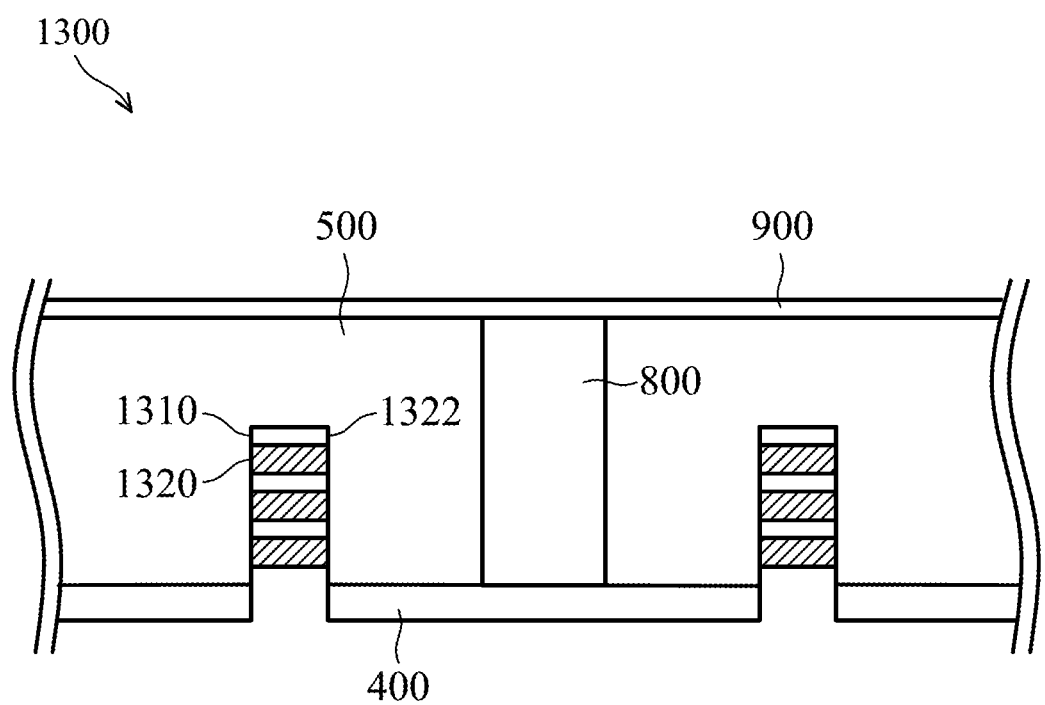
FIGS. 13 and 14 illustrates cross-sectional views cut along a direction of the gate (X-X direction in FIG. 17) of a semiconductor device, made by the method of FIG. 1, during various fabrication stages in accordance with some embodiments for a GAAFET device.

FIGS. 2-12 illustrate a formation method of a FinFET 200 with semiconductor fins 312. Alternatively, other transistor devices may be formed, such as a GAAFET, for example. Below is described formation of a GAAFET instead of a FinFET, with the steps of forming semiconductor fins 1312 with alternating first semiconductor layers 1320, acting as sacrificial layers, and second semiconductor layers 1322 for a GAAFET device 1300 as shown in FIG. 13, which for GAAFET device production, replaces the semiconductor fins 312 formation of FIG. 3. FIG. 13 illustrates a structure corresponding to FIG. 9, but for a GAAFET device.

As illustrated in the example of FIG. 13, the semiconductor layers 1320 and 1322 are formed as a stack over the semiconductor substrate 202. The first semiconductor layers 1320 and the second semiconductor layers 1322 are alternatingly disposed on top of one another (e.g., along the Z direction) to form a stack. For example, one of the second semiconductor layers 1322 is disposed over one of the first semiconductor layers 1320 then another one of the first semiconductor layers 1320 is disposed over the second semiconductor layer 1322, so on and so forth.

The stack may include any number of alternately disposed semiconductor layers 1320 and 1322. The semiconductor layers 1320 and 1322 may have different thicknesses. The first semiconductor layers 1320 may have different thicknesses from one layer to another layer. The second semiconductor layers 1322 may have different thicknesses from one layer to another layer. The thickness of each of the semiconductor layers 1320 and 1322 may range from a few nanometers to a few tens of nanometers. The first layer of the stack may be thicker than other semiconductor layers 1320 and 1322. In an embodiment, each of the first semiconductor layers 1320 has a thickness ranging from about 5 nanometers (nm) to about 20 nm, and each of the second semiconductor layers 1322 has a thickness ranging from about 5 nm to about 20 nm.

The two semiconductor layers 1320 and 1322 have different compositions. In various embodiments, the two semiconductor layers 1320 and 1322 have compositions that provide for different etch selectivity between the layers, in particular such that the first semiconductor layers 1320 act as sacrificial layers during a process of removing the first semiconductor layers 1320.

In various embodiments, the semiconductor layers 1322 may be intentionally doped. For example, when the GAA transistor device 1300 is configured in n-type (and operates in an enhancement mode), each of the semiconductor layers 1322 may be silicon that is doped with a p-type dopant such as boron (B), aluminum (Al), indium (In), and gallium (Ga); and when the GAA transistor device 1300 is configured in p-type (and operates in an enhancement mode), each of the semiconductor layers 220 may be silicon that is doped with an n-type dopant such as phosphorus (P), arsenic (As), antimony (Sb). In another example, when the GAA transistor device 1300 is configured in n-type (and operates in a depletion mode), each of the semiconductor layers 1322 may be silicon that is doped with an n-type dopant instead; and when the GAA transistor device 1300 is configured in p-type (and operates in a depletion mode), each of the semiconductor layers 1322 may be silicon that is doped with a p-type dopant instead. In some embodiments, each of the semiconductor layers 1320 is $Si_{1-x}Ge_x$ that includes less than 50% (x<0.5) Ge in molar ratio.

Either of the semiconductor layers 1320 and 1322 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 1320 and 1322 may be chosen based on providing differing etch selectivity.

The semiconductor layers 1320 and 1322 can be epitaxially grown from the semiconductor substrate 202. For example, each of the semiconductor layers 1320 and 1322 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 202 extends upwardly, resulting in the semiconductor layers 1320 and 1322 having the same crystal orientation with the semiconductor substrate 202.

The entire stack of semiconductor layers 1320 and 1322 may be patterned to form the fins 1310. For example, a photolithographic process may be employed, where a patterned photoresist is used as an etch mask to etch the entire stack of semiconductor layers 1320 and 1322 to form the fins 1310.

The material of the first dummy gate 500, second dummy gate 900, and the first semiconductor layers 1320 (sacrificial layer) may be chosen to facilitate removal of the dummy gates 500 and 900, and formation of GAA formation including removing the sacrificial layer (first semiconductor layers 1320). As one example, the first dummy gate 500 may be SiGe, the second dummy gate 900 may be Si, and the sacrificial layer may be SiGe. As another example, the first dummy gate 500 may be SiGe with a low Ge concentration percent, the second dummy gate 900 may be Si, and the sacrificial layer may be SiGe with a high Ge concentration percent. As another example, the first dummy gate 500 may be Si, the second dummy gate 900 may be Si, and the sacrificial layer may be SiGe.

Figure 14:
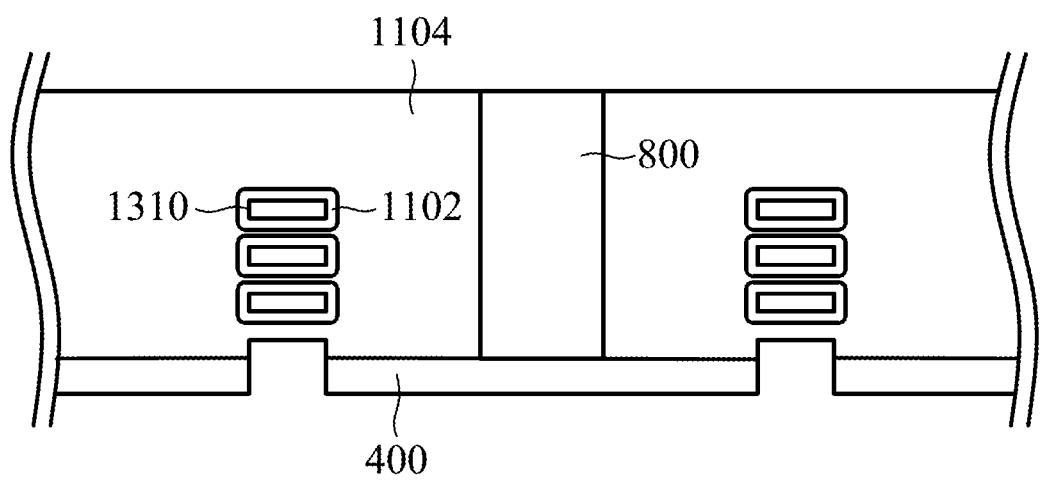

For the GAAFET 1300, the dummy gate removal and conductive gate replacement of FIGS. 11 and 12 is replaced by the dummy gate removal and conductive gate replacement, and GAA formation of FIG. 14 except that the dielectric isolation 1200 may or may not be formed.

In accordance with FIG. 14, the first semiconductors 1320 (sacrificial layer) have been removed in addition to the dummy gates 500 and 900, and thus are not shown in FIG. 14. The semiconductor layers 1320 are removed by applying a selective etch (e.g., a hydrochloric acid (HCl)), while leaving the semiconductor layers 1322 substantially intact. After the removal of the semiconductor layers 1320, respective bottom surfaces and top surfaces of each of the semiconductor layers 1322 may be exposed.

The gate dielectric 1102 is then formed such it wraps around the semiconductor layers 1322, followed by formation of the conductive gate electrode 1104, which also wraps around the semiconductor layers 1322, which function as the fins 1310. The gate dielectric 1102 and gate electrode 1104 may be formed by materials and methods discussed above with respect to FIG. 11.

Figure 15:
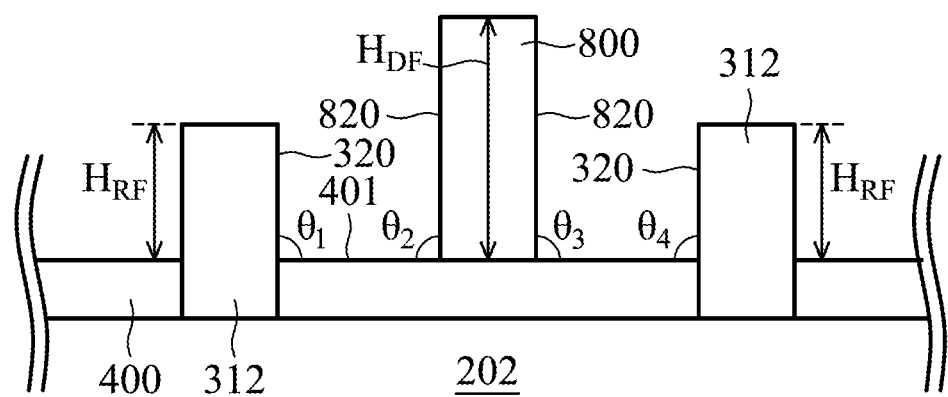
FIG. 15 illustrates angular and height parameters of semiconductor and dummy fins of a device, in accordance with some embodiments.

FIG. 15 illustrates a cross sectional view of a region of a semiconductor device, which can be either the FinFET 200 or the GAAFET 1300 as described above, for example, illustrating the semiconductor fins 312 (or 1310 for the GAAFET) and the dummy fin 800. The semiconductor device includes a dielectric isolation structure 400 with an upper surface 401, which is horizontal.

The semiconductor fins 312 are disposed on the substrate 202. The semiconductor fins 312 further have semiconductor fin sidewalls 320. The dummy fin 800 is disposed on the dielectric isolation structure 400. The dummy fin 800 further has dummy fin sidewalls 820. Based on the different processing to form the dummy fin 800 and the semiconductor fins 312, according to some embodiments the angle between upper surface 401 of the dielectric isolation structure the fin sidewalls is different for the dummy fin 800 and the semiconductor fins 312. Specifically, an angle between the horizontal upper surface 401 of the dielectric isolation structure 400 and an adjacent of the semiconductor fin sidewalls 320 is greater than 90°, and an angle between the horizontal upper surface 401 of the dielectric isolation structure and an adjacent of the dummy fin sidewalls 820 is less than or equal to 90°. That is the angles $\theta_1$ and $\theta_4$ as shown in FIG. 15 are greater than 90°, while the angles $\theta_2$ and $\theta_3$ as shown in FIG. 15 are less than or equal to 90°. The angles $\theta_1$ and $\theta_4$ may be in the range of 95° to 150°, for example 110°, while the angles $\theta_2$ and $\theta_3$ may be in the range of 30° to 90°, for example 90°.

Further as shown in FIG. 15, the height of the semiconductor fins 312 is given by $H_{RF}$, and the height of the dummy fin 800 is given by $H_{DF}$. The height of the dummy fin 800 may be greater than or equal to the height of the semiconductor fins 312. The height of the dummy fin 800 may be achieved by the amount of planarization processing where a large amount of planarization will reduce the dummy fin 800 height. Whether $H_{DF}$ is greater than or equal to $H_{RF}$ depends on the desired functionality. For example, $H_{DF}$ being greater than $H_{RF}$ may be desired for facilitation of cutting the dummy, or metal, gate for gate isolation due to a shallow cut depth. On the other hand $H_{DF}$ having a same height as $H_{RF}$ provides an increased process window for dummy gate patterning.

Figure 16:
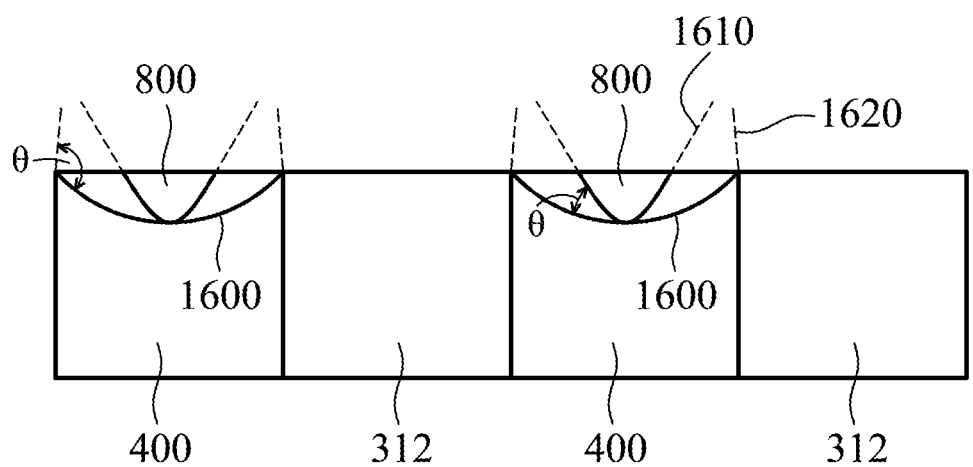
FIG. 16 illustrates a portion of the device with a smile curve in accordance with some embodiments.

FIG. 16 illustrates a portion of the device with a smile curve 1600 in accordance with some embodiments. FIG. 16 illustrates semiconductor fins 312 and two lower portions of dummy fins 800 adjacent the dielectric isolation 400. A smile curve 1600 is at a boundary between the dielectric isolation 400 and a region where the lower portions of dummy fins 800 contact the dielectric isolation 400. A first line 1610 is taken as the line extending along a sidewall of one of the dummy fins 800. A second line 1620 is taken as the line extending along a sidewall of one of the semiconductor fins 312. The angle θ between the first line 1610 and the smile curve 1600 is less than 90°, while the angle θ between the second line 1620 and the smile curve 1600 is greater than 90°.

Figure 17:
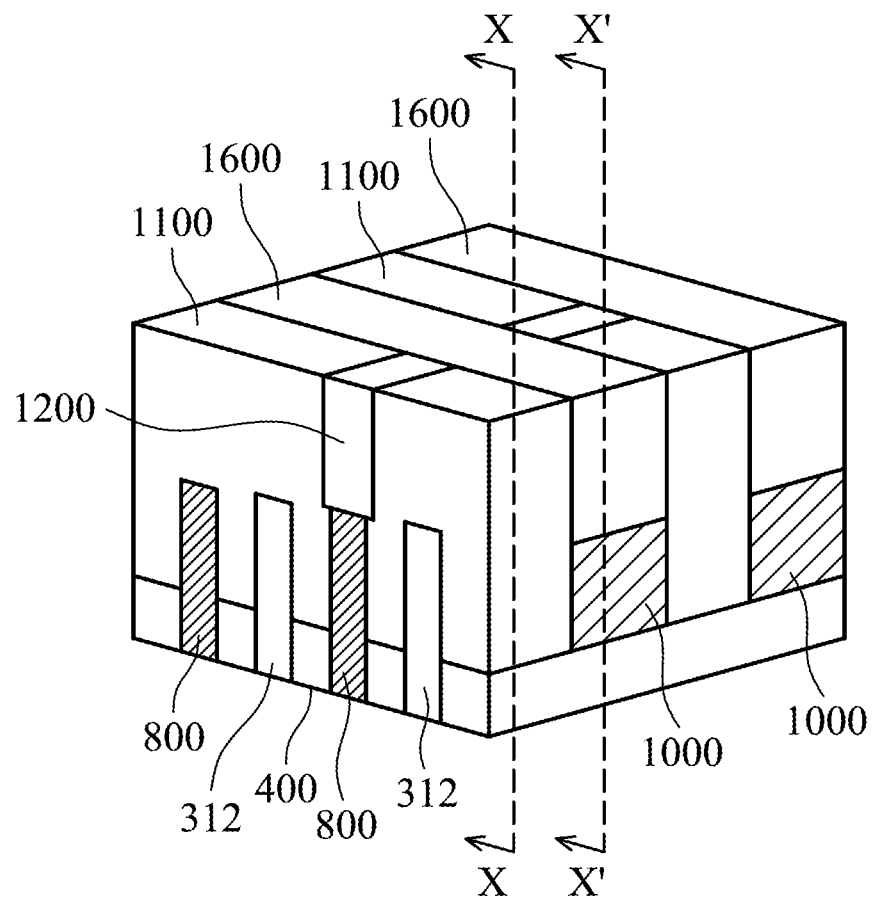
FIG. 17 illustrates a perspective view of the semiconductor device according to some embodiments.

FIG. 17 illustrates a perspective view of the semiconductor device 200 according to some embodiments. The semiconductor device 200 includes semiconductor fins 312 extending above the substrate and through dielectric isolation (STI) 400. The active gates 1100 are formed over the semiconductor fins 312, which act as channels between the S/D structures 1000. The ILD 1600 is disposed above the S/D structures 1000 and adjacent the active gates 1100. Dielectric isolation 1200 is formed in the active gates 1100 to some of the dummy fins 800.

In one aspect of the present disclosure, a method of fabricating a semiconductor device is disclosed. The method includes forming semiconductor fins on a substrate. A first dummy gate is formed over the semiconductor fins. A recess is formed in the first dummy gate, and the recess is disposed between the semiconductor fins. A dummy fin material is formed in the recess. A portion of the dummy fin material is removed to expose an upper surface of the first dummy gate and to form a dummy fin. A second dummy gate is formed on the exposed upper surface of the first dummy gate.

In another aspect of the present disclosure, a semiconductor device is disclosed. The semiconductor device includes a substrate. A dielectric isolation structure is disposed on the substrate and has a horizontal upper surface. Semiconductor fins having semiconductor fin sidewalls are disposed on the substrate. A dummy fin having dummy fin sidewalls are disposed between the semiconductor fins and on the dielectric isolation structure. A conducting gate is disposed over the semiconductor fins and the dummy fin, and contacts the dielectric isolation structure. An angle between the horizontal upper surface of the dielectric isolation structure and an adjacent of the semiconductor fin sidewalls is greater than 90°, and an angle between the horizontal upper surface of the dielectric isolation structure and an adjacent of the dummy fin sidewalls is less than 90°.

In another aspect of the present disclosure, a method of fabricating a semiconductor device is disclosed. The method includes forming semiconductor fins on a substrate. A first dummy gate is formed over the semiconductor fins. A recess is formed in the first dummy gate, and the recess is disposed between the semiconductor fins. A material is formed in the recess. A portion of the material is removed to expose an upper surface of the first dummy gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming semiconductor fins on a substrate;
   forming a first dummy gate over the semiconductor fins;
   forming a recess in the first dummy gate, the recess disposed between the semiconductor fins;
   forming dummy fin material in the recess;
   removing a portion of the dummy fin material to expose an upper surface of the first dummy gate and to form a dummy fin; and
   forming a second dummy gate on the exposed upper surface of the first dummy gate,
   wherein the forming a recess in the first dummy gate exposes an underlying dielectric isolation structure of the semiconductor device.

2. The method of claim 1, wherein removing a portion of the dummy fin material comprises planarizing the dummy fin material.

3. The method of claim 1, wherein forming the dummy fin material comprises:
   forming a first dummy fin sub-layer in the recess; and
   forming a second dummy fin sub-layer on the first dummy fin sub-layer.

4. The method of claim 3, further comprising:
   removing portions of the first dummy fin sub-layer and the second dummy fin sub-layer from an upper region of the recess.

5. The method of claim 4, further comprising:
   conformally forming a third dummy fin sub-layer on the upper surface of the first dummy gate and to fill the upper region of the recess.

6. The method of claim 5, further comprising:
   removing a portion of the third fin sub-layer to expose the upper surface of the first dummy gate.

7. The method of claim 1, wherein the dummy fin material comprises a dielectric material.

8. The method of claim 1, further comprising:
after forming the second dummy gate, replacing the first dummy gate and the second dummy gate with a conducting gate.

9. The method of claim 8, wherein a top surface of the conducting gate is above a top surface of the dummy fin.

10. The method of claim 1, wherein a height of the dummy fin is greater than a height of the semiconductor fins formed on the substrate.

11. The method according to claim 1, wherein forming a recess in the first dummy gate comprises forming a recess in the dielectric isolation structure, and the dummy fin material is formed in the recess in the dielectric isolation structure.

12. The method according to claim 1, wherein forming a recess in the first dummy gate does not form a recess in the dielectric isolation structure.

13. The method according to claim 12, wherein forming a recess in the first dummy gate comprises an etch process selective to etching the first dummy gate over the dielectric isolation structure.

14. The method according to claim 1, wherein the first dummy gate is made of a material different from that of the second dummy gate.

15. A method of fabricating a semiconductor device, comprising:
forming semiconductor fins on a substrate;
forming a first dummy gate over the semiconductor fins;
forming a recess in the first dummy gate, the recess disposed between the semiconductor fins;
forming dummy fin material in the recess;
removing a portion of the dummy fin material to expose an upper surface of the first dummy gate and to form a dummy fin;
forming a second dummy gate on the exposed upper surface of the first dummy gate;
after forming the second dummy gate, replacing the first dummy gate and the second dummy gate with a conducting gate, wherein a top surface of the conducting gate is above a top surface of the dummy fin;
etching a recess in the top surface of the conducting gate to expose the top surface of the dummy fin; and
filling the recess in the top surface of the conducting gate with a dielectric to provide gate isolation.

16. A method of fabricating a semiconductor device, comprising:
forming semiconductor fins on a substrate;
forming a first dummy gate over the semiconductor fins;
forming a recess in the first dummy gate, the recess disposed between the semiconductor fins;
forming dummy fin material in the recess;
removing a portion of the dummy fin material to expose an upper surface of the first dummy gate and to form a dummy fin;
forming a second dummy gate on the exposed upper surface of the first dummy gate, wherein each of the semiconductor fins formed on the substrate comprise alternating layers of semiconductor sub-layers and sacrificial layers; and
removing the sacrificial sub-layers.

17. The method of claim 16, wherein the forming a recess in the first dummy gate exposes an underlying dielectric isolation structure of the semiconductor device.

18. The method according to claim 16, wherein the second dummy gate is made of a material different from that of the sacrificial sub-layers.

19. The method of claim 16, wherein removing a portion of the dummy fin material comprises planarizing the dummy fin material.

20. The method of claim 16, wherein the dummy fin material comprises a dielectric material.

* * * * *